United States Patent [19]
Payne

[11] Patent Number: 5,959,905
[45] Date of Patent: Sep. 28, 1999

[54] CELL-BASED INTEGRATED CIRCUIT DESIGN REPAIR USING GATE ARRAY REPAIR CELLS

[75] Inventor: Robert L. Payne, San Jose, Calif.

[73] Assignee: VLSI Technology, Inc., San Jose, Calif.

[21] Appl. No.: 08/962,608

[22] Filed: Oct. 31, 1997

[51] Int. Cl.⁶ .................................................. G11C 13/00
[52] U.S. Cl. .............................. 365/200; 365/51; 365/63
[58] Field of Search .............................. 365/200, 51, 63

[56] References Cited

U.S. PATENT DOCUMENTS 4,321,695  3/1982  Redwine et al. ..................... 365/200

*Primary Examiner*—Terrell W. Fears
*Attorney, Agent, or Firm*—Burns, Doane, Swecker & Mathis LLP

[57] ABSTRACT

Repair cells for performing metal-only functional repairs in a cell-based circuit layout design are described. The repair cells include a gate array under layer made-up of a group of uncommitted (not interconnected) transistors. A cluster of cells can be placed within the cell-based design in various locations and can be coupled together to form logic function elements. The repair cells can be added to cell-based designs during the metalization processing steps so as to repair/change the cell-based design's function. Furthermore, repair cells can be used as feedthrough cells to facilitate routing in the cell-based circuit layout. In this case, feedthrough cells having gate array underlayers may be arranged in columns or are placed in strategic spots within the layout to facilitate routing.

18 Claims, 2 Drawing Sheets

3 TRACK GATE ARRAY CELL

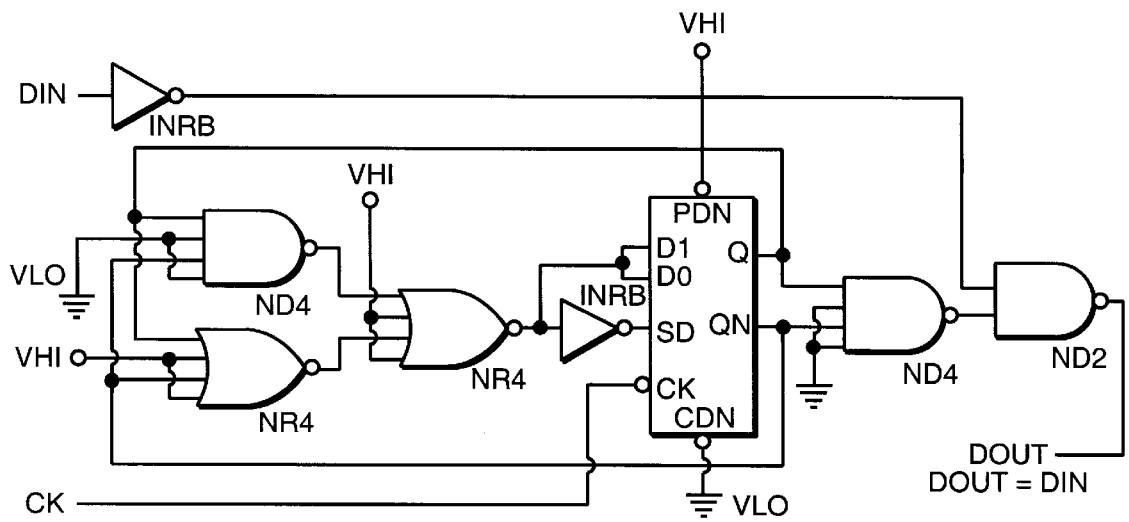
FIG._1 (PRIOR ART)
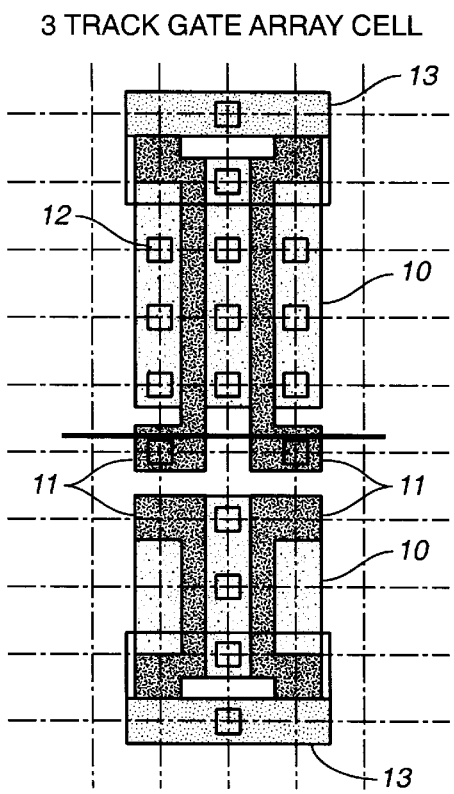
FIG._2

CELL AREA PRIOR TO FEED THROUGHS ADDED
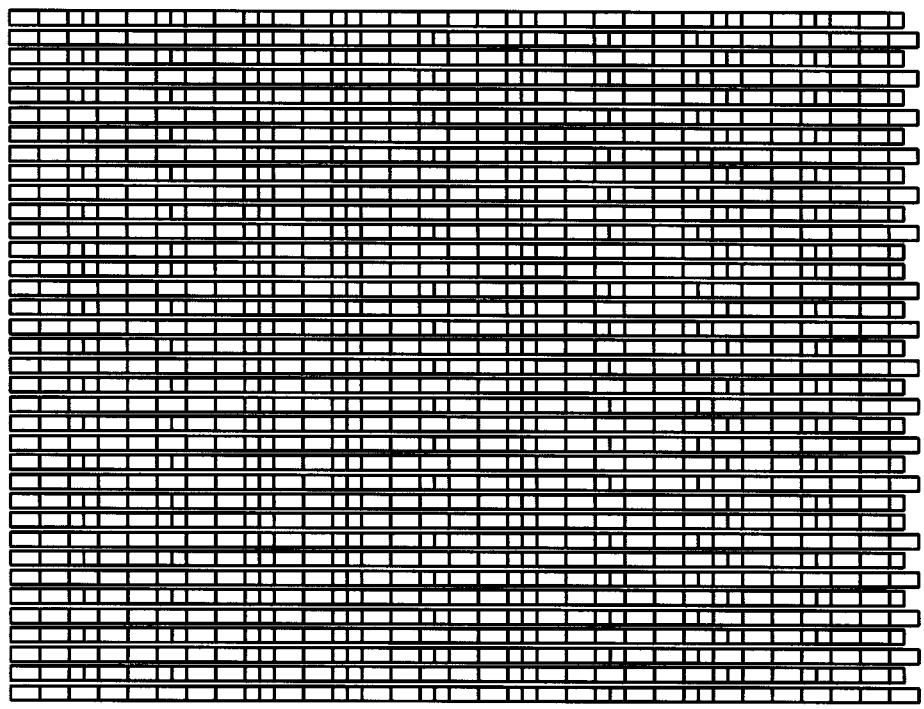
FIG._3
CELL AREA AFTER GA FEED THROUGHS ADDED
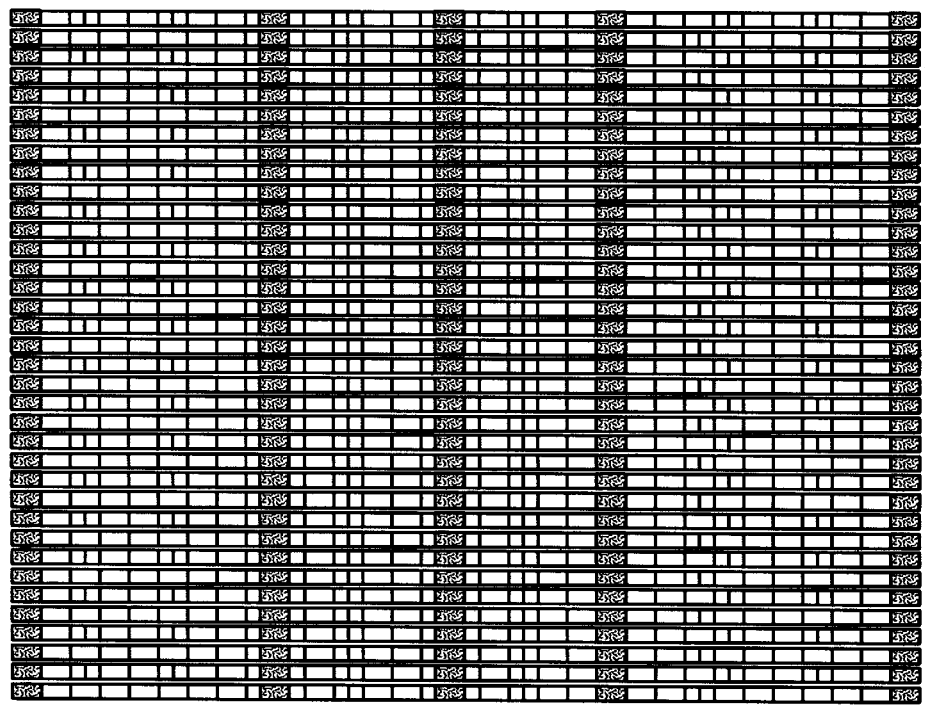
FIG._4

CELL-BASED INTEGRATED CIRCUIT DESIGN REPAIR USING GATE ARRAY REPAIR CELLS

BACKGROUND OF THE INVENTION

1. Field of the Invention

The present invention relates to cell based ASIC designs and particularly to repairing cell based ASIC designs.

2. State of the Art

Customized integrated circuits that perform a specific function, sometimes referred to as ASICs, can be implemented using a gate array (GA). A GA comprises an array of transistors that are uncommitted (i.e. not interconnected) prior to the metalization step of the integrated circuit process. Commonly, the GA is made-up of a plurality of cells—each cell including one or more uncommitted transistors. An ASIC having a particular function can be created by patterning metalization layers to interconnected transistors into a particular circuit configuration so as to cause the gate array to perform the ASIC's specific function. The advantage of GA is its superior fabrication cycle time and ability to accommodate circuit function modifications (repairs to the logic design) rapidly allowing the customer to receive new prototype parts and ramp to high volume production more quickly. The problem with the GA style implementation is that while it provides superior prototype cycle time, it comes at the expense of lower gate density and therefor higher cost. As industry has moved to higher levels of integration with design reuse at the system block level, interest in GA style implementation has been fading.

Instead of using gate arrays, ASICs are now more commonly being implemented with interconnected logic cells (referred to as a cell-based ASIC implementation) instead of an array of transistors. In this type of implementation, each logic cell comprises one or more logic gates such as NAND, NOR gates, invertors, and flip-flops. An ASIC is formed by interconnecting the inputs and outputs of the logic cells with metalization layers to obtain the desired ASIC function. One of the main advantages of a cell-based ASIC implementation is that a library of generic optimized logic cells can be used to design different ASICs and achieve significantly higher gate density which correlates directly to lower product cost and in many cases higher performance.

In cell-based integrated circuit design, metal-only repairs are conventionally performed using repair cells referred to as spare gates which are randomly dispensed throughout the cell-based design. Spare gates generally comprise a collection of transistors coupled together into logic gates which perform a certain function. FIG. 1 shows a typical spare gate logic design which includes a variety of interconnected gates and a D flip-flop. By seeding the layout with this spare gate block when logic changes are required or desired, the spare gate resource can be reconfigured to become part of the customer function. The spare gates can be any of the functions in the cell-based library. The customer can select his own unique combination of gates which he believes may be most useful for repair of his logic function.

One case in which spare gates are used for metal-only functional repairs occurs when fabricating ASIC devices and some wafers are held prior to metal while and the remainder are completed. A functional analysis is performed on the completed devices to determine if they require any simple repairs (i.e., functional modifications) using the spare gates. The remaining wafers which were held prior to metal can then be processed using redesigned metal masks which interconnect spare gates into the ASIC device. This allows for relatively quick metal-only functional fixes without needing to restart wafers from the first step in the process thereby saving several weeks of processing and design time and reducing cost. The problem with the spare gate repair technique is that it is not very flexible. Specifically, when implementing a spare gate in a cell-based design as a repair cell it can only be used to repair/or replace areas needing the same function as the spare gate. As a result, if a certain type of spare gate is unavailable or is unroutable to the repair area then the repair option of metal-only is also unavailable. Consequently, spare gate cell repair presents limitations to the type of functional repairs that are possible in a cell-based implemented integrated circuit.

The present invention is a technique for optimizing metal-only functional repair in a cell-based implemented ASIC.

SUMMARY OF THE INVENTION

The present invention utilizes repair cells each having a gate array underlayer for performing metal-only functional repairs in a cell-based circuit layout design instead of using spare gate repair cells. In accordance with one embodiment of the present invention, a plurality of repair cells having a gate array type underlayer are scattered throughout the cell-based circuit layout. Each repair cell underlayer comprises a set of uncommitted transistors. One or more of the cells can be interconnected together to implement essentially any logical function. The repair cell library is designed to be 100% inter-operable with the cell-based library. In one embodiment, the gate array underlayer comprises two PMOS and two NMOS transistors to facilitate CMOS design compatibility.

In accordance with another embodiment of the present invention, the gate array repair cell is implemented as a feedthrough cell which is used to facilitate cell routing. According to this embodiment, gate array underlayer feedthrough cells can be configured into vertical columns. In addition, the feedthrough cells of the present invention can be used to add space between cells so as to edge justify the cell rows of the cell-based circuit layout, also facilitate routing.

In one embodiment, cells are clustered so as to facilitate the formation of any logical function by interconnecting the cells. Furthermore, cells are clustered in the middle, the ends, or clustered at any combination of boundaries in the cell row.

BRIEF DESCRIPTION OF THE DRAWINGS

FIG. 1 shows an example of a prior art spare gate cell used for metal-only repairs in a cell-based integrated circuit design.

FIG. 2 shows one embodiment of a gate array underlayer layout in accordance with the present invention.

FIG. 3 shows a typical prior art cell-based ASIC design layout prior to adding feedthroughs.

FIG. 4 shows a cell-based ASIC design layout having gate array underlayer feedthroughs in accordance with one embodiment of the present invention.

DESCRIPTION OF PREFERRED EMBODIMENTS

The present invention is a cell-based integrated circuit design that uses a repair cell having a gate array (GA) underlayer for performing metal-only functional repairs and a method of implementing the repair cells thereof. The repair cell GA underlayer includes a set of uncommitted (i.e. not connected) switching devices. Clusters (i.e., more than one) of the GA cells can be dispensed in certain areas throughout the integrated circuit design to obtain flexible repair options. In the case in which a repair is needed, clusters of repair cells can be interconnected together to form logic circuits having a variety of logic functions which can include simple logic gates such as OR and AND gates and more complex logic functions such as flip-flops and registers. The advantage of implementing GA repair cells instead of spare gates is that clusters of the GA repair cells of the present invention in the vicinity of the area to be repaired (i.e., functionally modified) can be interconnected together to obtain a variety of different logical functions for the repair, whereas, if the predefined functions of the spare gate repair cells in the vicinity of the area needing repair does not have the desired function, no repair is available.

FIG. 2 shows one embodiment of a GA underlayer layout in accordance with the present invention. The gate array is referred to as an underlayer since the gate array is made-up of diffusions formed beneath the top layer of the IC device which are subsequently covered by other processing layers and which are generally accessible to interconnection through vias and metal layers.

The GA repair cell shown in FIG. 2 is made up of 4 devices (2 PMOS and 2 NMOS) so as to facilitate the formation of one CMOS gate. For each pair of devices, the gate array cell includes a diffusion area 10, two gate contacts 1, source/drain contacts 12, and power supply and ground contacts 13.

Gate array cells are well known in the field of integrated circuit design and hence it should be noted that the gate array underlayer layout shown in FIG. 2 corresponds to a conventional gate array cell as used in a gate array type IC design. Hence, the repair cell used in the present invention may be implemented with a gate array design which includes more or less switching devices than that shown in FIG. 2. However, it should be further understood that the gate array repair cell according to the present invention comprises at least one or more uncommitted switching devices.

In one embodiment of the present invention, a library of gate array repair cells which include a number of different gate array underlayer designs can be provided for repair of a cell-based IC layout design. For instance, one gate array repair cell may include four switching devices while another, two devices. Alternatively, the gate array repair cell may be oriented in a particular manner to facilitate placement in the IC layout design or to facilitate a particular type of clustering adaptive to an anticipated desired function.

According to one embodiment of the present invention, clusters of the gate array repair cells are placed within the cell-base IC in particular locations such as in the middle, the ends, or any combination of boundaries (example) in the cell row. These clusters of gate arrays can then be interconnected if necessary to obtain a particular function to facilitate repair within the cell-based IC.

In another aspect of the present invention, gate array repair cells are incorporated into feedthrough cells so as to facilitate routing within the cell-based IC design while at the same time providing a gate array underlayer for metal-only functional repair capability. Conventionally, feedthrough cells are placed within the cell-based design to provide space between the main IC cells. Feedthrough cells are dummy cells that are absent any circuitry other than power or ground buses. Commonly, feedthrough cells are inserted into the IC layout after a cell-based circuit design is finished so as to ensure that cell row lengths are justified (i.e. matched) and thus facilitating routing within the IC layout design. FIG. 3 shows a cell-based IC design (made up of a plurality of rows of cells) prior to adding feedthroughs to the design. As can be seen, the right most edges of the rows do not match.

When a design is found to be unroutable due to inadequate vertical routing space the design is commonly made to be routable by adding more feedthroughs to each row. Consequently, a typical layout design therefore has many feedthrough cells added to it. In accordance with the present invention, gate array underlayers are incorporated into feedthrough cells so that metal-only repair capability is provided to the cell-based design at the same time as providing additional routing space. FIG. 4 shows a cell-based design having feedthroughs added. The shaded areas in the cell rows are examples of where GA under layer feedthrough repair cells might be placed. It should be understood that the gate array underlayer feedthrough cells may also be placed in vertical columns to create an efficient vertical routing channel.

Another aspect of the gate array repair cell is that it is designed to be 100% interoperable with the cell-based IC library. The interoperability of the feedthrough repair cell library and the cell-based cell library is dependent on many of the individual design aspects of each of the repair cell and cell-based cell. Hence, the gate array repair cell is designed so its design aspects such as power bus width and location, diffusion separation distances, spaces between and width of metal buses are the same as or operable with the cell-based IC library. For instance, one design aspect that is considered for interoperability is cell height which is generally an integer multiple of the routing track width. Specifically, the cell height of a typical cell-based library is shorter than the traditional GA cell. To achieve interoperability, the GA cell must be made to have the same cell height as the cell-based counterpart or be an integer multiple of the cell-based counterpart. In one embodiment, a GA repair cell having a cell height of (9 routing tracks) is clustered to form a group of twelve repair cells. This cluster of cells would be adaptable to a cell-based design in which cells have a cell height of (9 routing tracks). This quantity of repair cells can be interconnected to form a D type flip flop.

Hence, a gate array under layer incorporated into feedthrough cells for performing metal-only functional repairs in a cell-based IC layout design is described.

In the preceding description, specific details are set forth, such as gate array type and repair cell placement in order to provide a thorough understanding of the present invention. It will be apparent, however, to one skilled in the art that these specific details need not be employed to practice the present invention. In other instances, well-known IC layout theory has not been described in detail in order to avoid unnecessarily obscuring the present invention.

Moreover, although the elements of the present invention have been described in conjunction with a certain embodiment, it is appreciated that the invention can be implemented in a variety of other ways. Consequently, it is to be understood that the particular embodiment shown and described by way of illustration is in no way intended to be considered limiting. Reference to the details of is embodiment is not intended to limit the scope of the claims which themselves recite only those features regarded as essential to the invention.

What is claimed is:

1. A cell-based design layout of an integrated circuit having an associated function, said layout comprising:

a plurality of cell-based logic cells each having transistors interconnected so as to perform at least one predetermined logic function;

a plurality of repair cells each including one or more unconnected transistors, said unconnected transistors and said repair cells being interconnectable to form at least one logic gate, said repair cells being scattered within said cell-based design layout;

at least one metalization layer for interconnecting said cell-based logic cells into said cell-based integrated circuit design layout so as to perform said associated function;

wherein, in the case in which said circuit design layout requires a metal-only modification said unconnected transistors and said repair cells can be interconnected with said at least one metalization layer to form said at least one logic gate and said at least one logic gate can be interconnected with said cell-based logic cells in order to repair said cell-based integrated circuit design layout.

2. The layout as described in claim 1 wherein said repair cells are used as feedthrough cells.

3. The layout as described in claim 1 wherein said uncommitted transistors are all PMOS.

4. The layout as described in claim 1 wherein said uncommitted transistors are all NMOS.

5. The layout as described in claim 1 wherein said uncommitted transistors include both PMOS and NMOS.

6. The layout as described in claim 2 wherein said feedthrough cells are placed in a vertical column.

7. The layout as described in claim 1 wherein said design layout includes a plurality of cell rows and a plurality of said repair cells are disposed in the middle of at least a portion of said cell rows.

8. The layout as described in claim 1 wherein said design layout includes a plurality of cell rows and a group of said repair cells are disposed at ends of at least a portion of said cell rows.

9. The layout as described in claim 1 wherein said repair cells are interoperable with cells in said cell-based design layout.

10. A method of providing metal-only modification capability to a cell-based integrated circuit design layout having a plurality of logic cells including transistors interconnected so as to perform at least one predetermined logic function, said logic cells having input and output ports, said layout including at least one metalization layer for interconnecting said input and output ports of said logic cells, said method comprising the steps of:

fabricating said cell-based integrated circuit design utilizing integrated circuit processing steps prior to the formation of said at least one metalization layer so as to include said plurality of logic cells and a plurality of repair cells, each repair cell including at least one unconnected transistor;

in a first case, interconnecting said plurality of logic cells using said at least one metalization layer so as to form said cell-based integrated circuit design; and in a second case in which said cell-based circuit design layout requires one of a functional modification and repair;

interconnecting said at least one unconnected transistor in at least one of said plurality of repair cells to form at least one logic function element using said at least one metalization layer of said design layout and interconnecting said at least one formed logic function element with said plurality of logic cells using said at least one metalization layer to implement said metal-only modification.

11. The method as described in claim 10 further comprising the step of using said repair cell as a feedthrough cell in said design layout.

12. The method as described in claim 10 further comprising the step of implementing said transistors as PMOS transistors.

13. The method as described in claim 10 further comprising the step of implementing said transistors as NMOS transistors.

14. The method as described in claim 10 further comprising the step of implementing said repair cell with both NMOS and CMOS transistors.

15. The method as described in claim 10 wherein said step of placing comprises positioning said repair cells in a vertical column within said design layout for facilitating routing.

16. The method as described in claim 10 wherein said step of placing comprises positioning said repair cells at the end of each cell row within said design layout.

17. The method as described in claim 10 wherein said step of placing comprises positioning said repair cells at essentially the middle of each cell row within said design layout.

18. The method as described in claim 10 wherein said step of placing comprises positioning said repair cells at the middle of each cell row within said design layout.

* * * * *